(12) United States Patent
Gilliland

(10) Patent No.: US 8,400,785 B2
(45) Date of Patent: Mar. 19, 2013

(54) APERTURE EDGE EMISSION SUPPRESSION USING FERRITE

(75) Inventor: Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 12/788,553

(22) Filed: May 27, 2010

(65) Prior Publication Data

US 2011/0292631 A1 Dec. 1, 2011

(51) Int. Cl.
*H05K 9/00* (2006.01)

(52) U.S. Cl. .......................................... 361/818

(58) Field of Classification Search .................. 361/818, 361/118, 800, 816; 174/350, 377, 382, 384, 174/387

See application file for complete search history.

(56) References Cited

U.S. PATENT DOCUMENTS

2004/0001299 A1* 1/2004 van Haaster et al. ......... 361/118

\* cited by examiner

*Primary Examiner* — Jeremy Norris
*Assistant Examiner* — Tremesha S Willis
(74) *Attorney, Agent, or Firm* — Jim Boice

(57) ABSTRACT

An electronic device is within a housing that has an aperture through an enclosure surface of the housing. A ferrite block is attached to an edge of the aperture, thus transforming electromagnetically-induced current next to the aperture into heat in order to reduce a voltage across the aperture, thereby suppressing aperture edge emissions.

16 Claims, 5 Drawing Sheets

APERTURE EDGE EMISSION SUPPRESSION USING FERRITE

BACKGROUND

The present disclosure relates to the field of equipment housing, and specifically to electronic equipment housing. Still more particularly, the present disclosure relates to suppressing aperture edge emissions in electronic equipment housings.

BRIEF SUMMARY

An electronic device is within a housing that has an aperture through an enclosure surface of the housing. A ferrite block is attached to an edge of the aperture, thus transforming electromagnetically-induced current next to the aperture into heat in order to reduce a voltage across the aperture, thereby suppressing aperture edge emissions.

DETAILED DESCRIPTION

Figure 1:
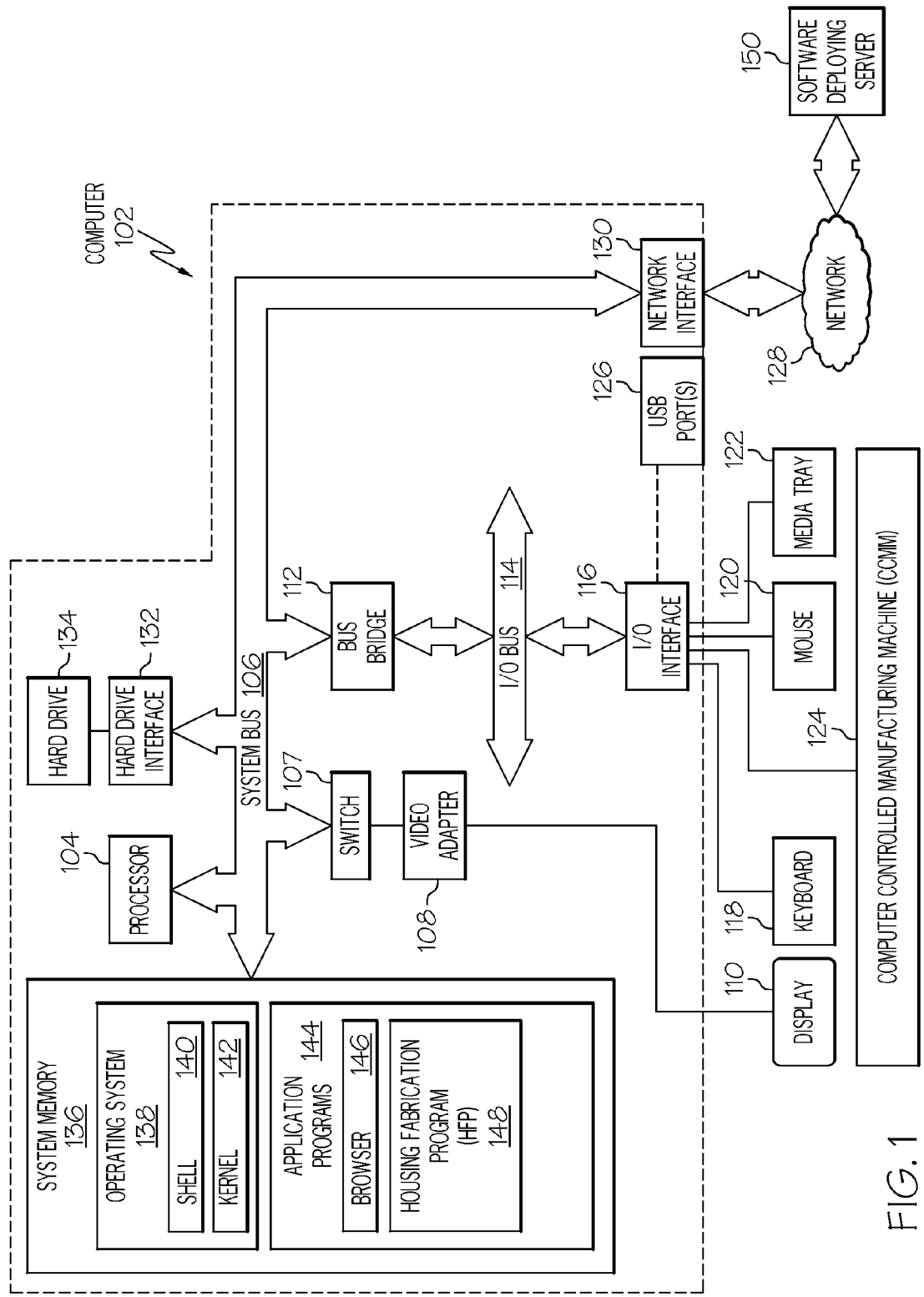
FIG. 1 depicts an exemplary computer which may be utilized in one embodiment of the present disclosure.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures, and in particular to FIG. 1, there is depicted a block diagram of an exemplary computer 102, which may be utilized by the present invention. Note that some or all of the exemplary architecture, including both depicted hardware and software, shown for and within computer 102 may be utilized by software deploying server 150.

Computer 102 includes a processor 104 that is coupled to a system bus 106. Processor 104 may utilize one or more processors, each of which has one or more processor cores. A video adapter 108, which drives/supports a display 110, is also coupled to system bus 106. In one embodiment, a switch 107 couples the video adapter 108 to the system bus 106. Switch 107 is a switch, preferably mechanical, that allows the display 110 to be coupled to the system bus 106, such that display 110 is functional only upon execution of instructions (e.g., housing fabrication program—HFP 148 described below) that support the processes described herein.

System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), and a computer controlled manufacturing machine (CCMM) 124, which is capable of punching holes into an enclosure surface of a housing for electronic equipment, affixing ferrite to edges of that hole, etc. as described herein. While the format of the ports connected to I/O interface 116 may be any known to those skilled in the art of computer architecture, in a preferred embodiment some or all of these ports are universal serial bus (USB) ports 126.

As depicted, computer 102 is able to communicate with a software deploying server 150 via network 128 using a network interface 130. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 in computer 102's system memory (as well as software deploying server 150's system memory) include a housing fabrication program (HFP) 148. HFP 148 includes code for fabricating the housing described herein, including that described in FIGS. 2-4, utilizing a process described in FIG. 5. In one embodiment, computer 102 is able to download HFP 148 from software deploying server 150, including in an on-demand basis, wherein the code in HFP 148 is not downloaded until needed for execution to define and/or implement the improved enterprise architecture described herein. Note further that, in one embodiment of the present invention, software deploying server 150 performs all of the functions associated with the present invention (including execution of HFP 148), thus freeing computer 102 from having to use its own internal computing resources to execute HFP 148.

The hardware elements depicted in computer 102 are not intended to be exhaustive, but rather are representative to highlight essential components required by the present invention. For instance, computer 102 may include alternate memory storage devices such as magnetic cassettes, digital versatile disks (DVDs), Bernoulli cartridges, and the like. These and other variations are intended to be within the spirit and scope of the present invention.

Figure 2:
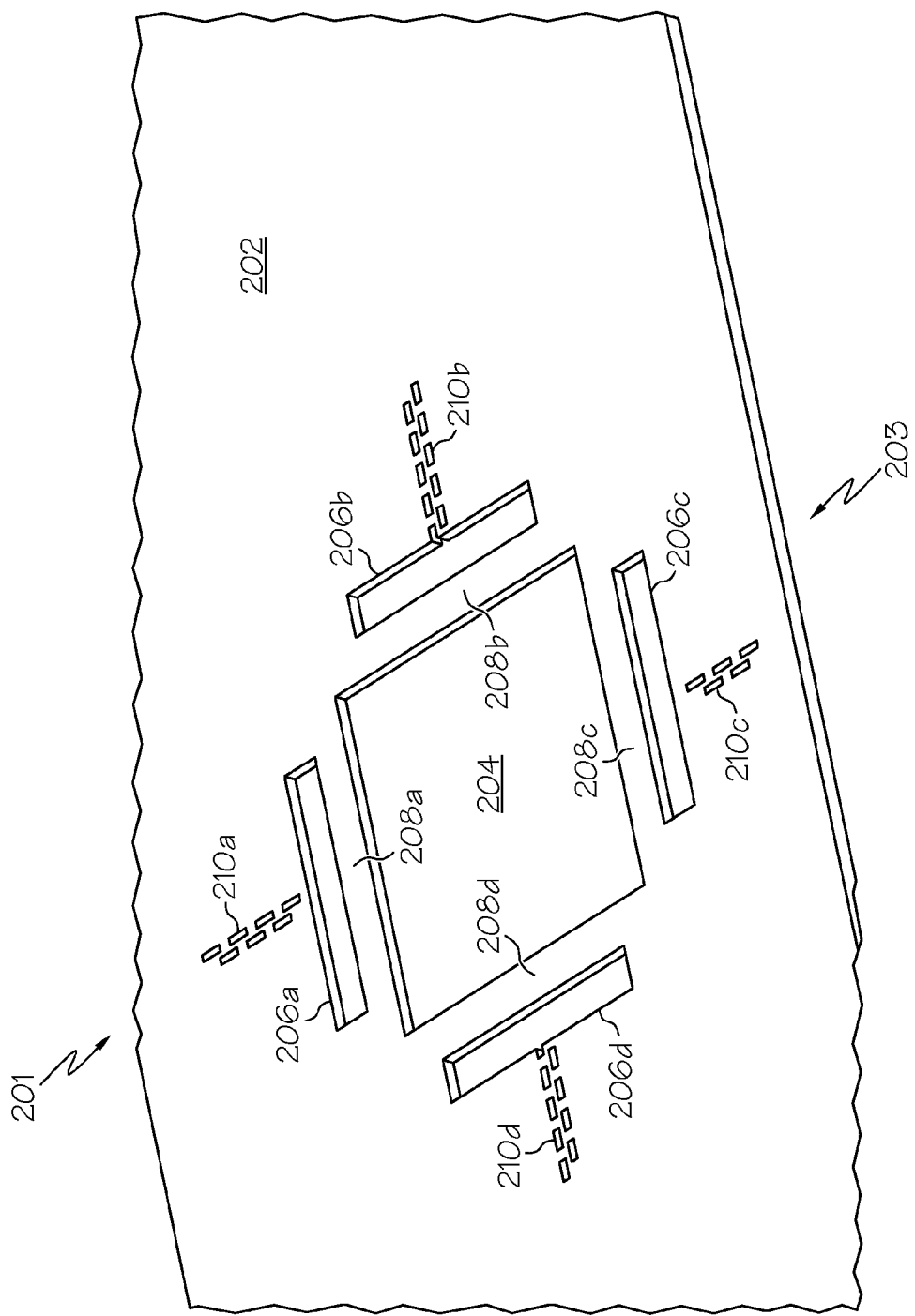
FIG. 2 illustrates an aperture passing through an enclosure surface of a housing of an electronic device.

Referring now to FIG. 2, an enclosure surface 202 of a housing (not shown) is depicted. Note that the term "enclosure surface" defines any surface of the housing, and thus can be a top, bottom, left side, right side, etc. of the housing. The housing may be for any electronic equipment that is susceptible to, or that generates, electromagnetism. While enclosure surface 202 is planar in order to provide the maximum improvement of the issues described herein, enclosure surface 202 may be curved, angular, irregularly shaped, etc. Whatever shape is used for enclosure surface 202, in one embodiment enclosure surface 202 is solid metal to provide the maximum improvement of the issues described herein. In all embodiments, enclosure surface 202 is metallic, and is therefore susceptible to electromagnetically-induced voltages, currents and secondary fields.

The housing may be for any type of equipment that emits or is sensitive to electromagnetically-induced voltages. For example, the housing may be for a drawer containing multiple server blades; a stand-alone computer; a piece of electronic test equipment, etc. Such devices often require openings that pass through the housing, in order to allow cooling air to pass through, to allow a user to visually see gauges, warning lights, etc. within the housing, etc. However, such openings, such as aperture 204 shown in FIG. 2, create a problem when the housing is exposed to electromagnetic radiation. More specifically, when electromagnetism, which has a wavelength that is larger than the opening of the aperture 204, strikes the enclosure surface 202, a voltage is induced across the aperture 204. This voltage is the result of voltage-resultant current passing from one end (201) of the enclosure surface 202 to another end (203) of the enclosure surface 202. The aperture 204 prevents a smooth flow of current from end 201 to end 203, since the current must flow about the edges of aperture 204. This causes a voltage drop across the aperture 204, which can result in secondary fields and inductions, since aperture 204 acts as a slot antenna. In order to avoid these issues, ferrite is mounted around the edges of aperture 204. In order to mount such ferrite, slots 206a-d are cut into the enclosure surface 202. These slots 206a-d result in ferrite mounts 208a-d. Ferrite mounts 208a-d are not themselves made of ferrite, but rather are remaining portions of the enclosure surface 202 to which ferrite blocks (described herein) are affixed. Impedance holes 210a-d are also cut into enclosure surface 202. As described herein, these impedance holes 210a-d force electromagnetically-induced current to flow into one or more of the ferrite mounts 208a-d and the ferrite mounted thereon. Note that while each of the sets of impedance holes 210a-d are depicted as aligning in straight lines in the figures, each set of impedance holes 210a-d may be configured to be curved, angled, or of a shape designed to raise the impedance to current flowing around the ferrite mounted on ferrite mounts 208a-d. The present disclosure thus permits open holes (e.g., aperture 204) to be cut into housings, rather than using openings that are covered by mesh, perforations, etc.

Figure 3:
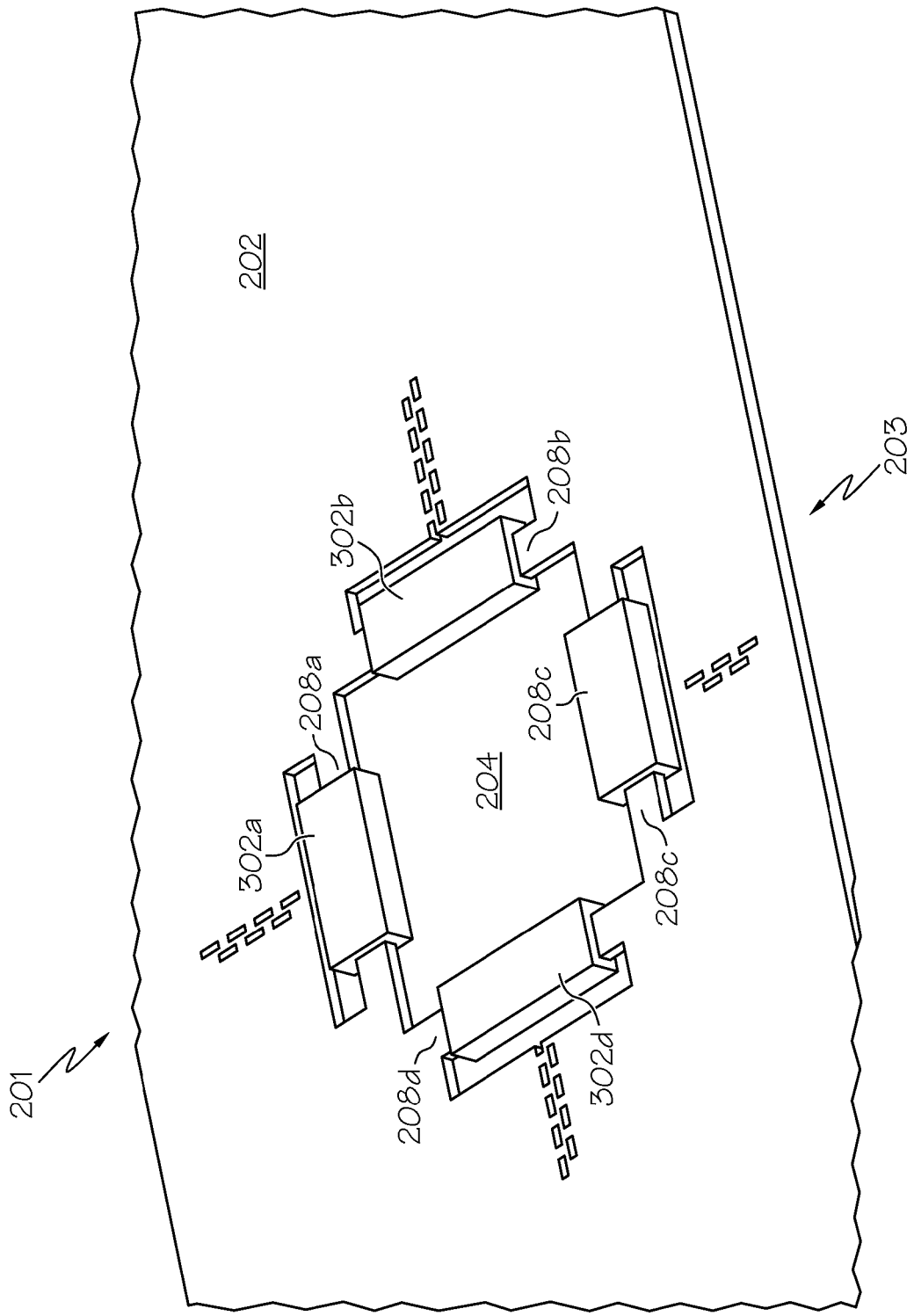
FIG. 3 depicts ferrite blocks mounted along edges of the aperture shown in FIG. 2.

Referring now to FIG. 3, ferrite blocks 302a-d are respectively mounted to ferrite mounts 208a-d. This mounting creates a physical and electrical connection between the ferrite blocks 302a-d and their respective ferrite mounts 208a-d. The ferrite blocks 302a-d are made of ferrite, which gives them the ability to convert electrical current into heat. This conversion is accomplished by internal magnetic areas within the ferrite block 302a-d attempting to realign themselves when they consume electrical current. However, the solid nature of the ferrite prevents such realignment, resulting in the generation of heat while the ferrite is consuming the electrical current. While ferrite blocks 302a-d are depicted as elongated blocks, ferrite blocks 302a-d may be any shape that permits electromagnetically-induced current to be transformed into heat.

Figure 4:
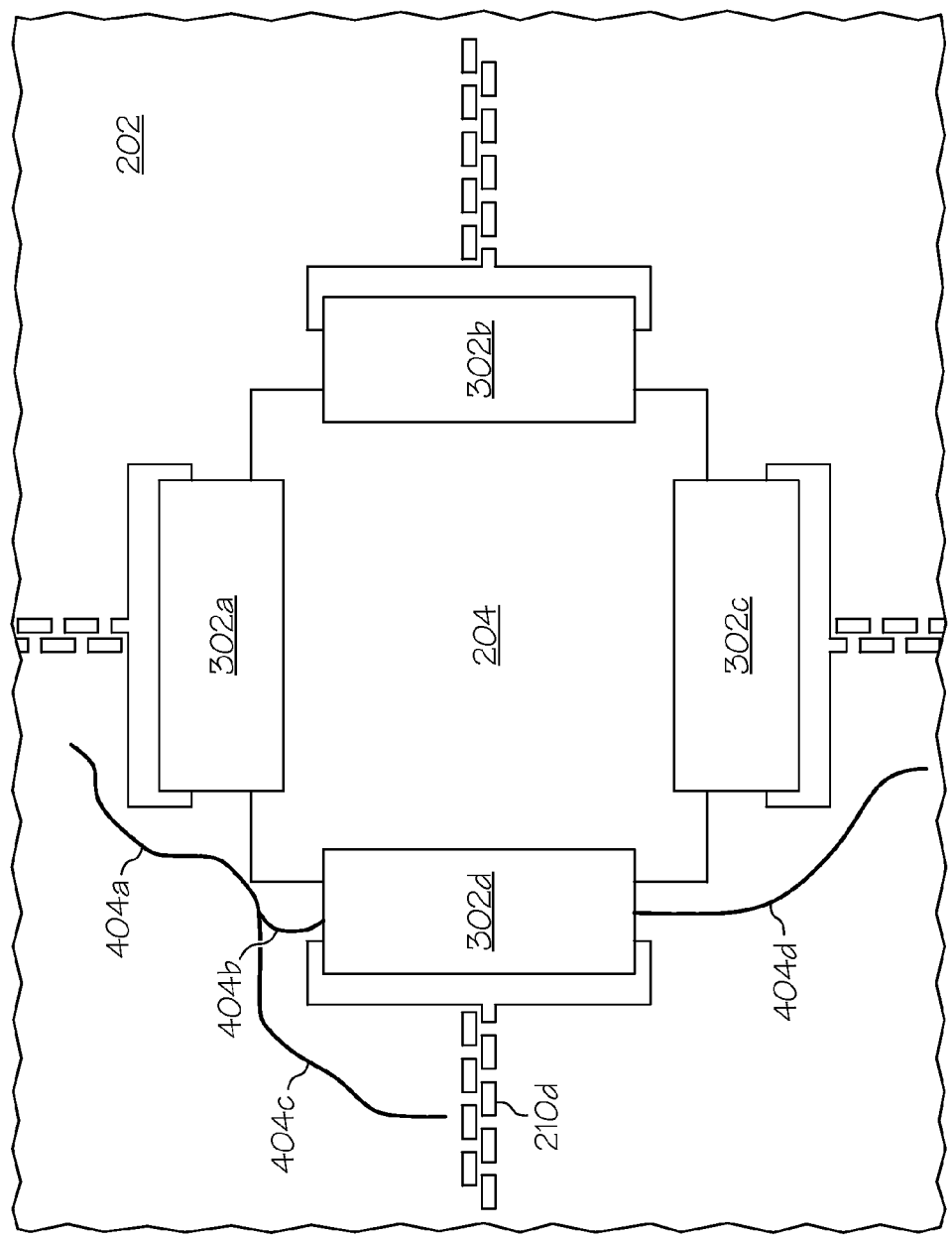
FIG. 4 illustrates a pathway of electromagnetically-induced current being directed through one of the ferrite blocks shown in FIG. 3.

With reference now to FIG. 4, assume that enclosure surface 202 has been impinged with (exposed to) electromagnetism that has a wavelength that is greater than the opening created by aperture 204. This impingement results in an electromagnetically-induced current, which begins as current 404a. Current 404a attempts to go around aperture 204, resulting in a split into currents 404b and 404c. However, current 404c is prevented from passing across the resistance caused by impedance holes 210d. Thus, the current 404a is directed as current 404b into the ferrite block 302d. Although a trace current 404d exits from ferrite block 302d, most of current 404b is consumed and converted into heat by ferrite block 302d. This prevents a voltage drop across aperture 204, and thus prevents any secondary fields, currents, etc. from forming around the aperture 204.

Figure 5:
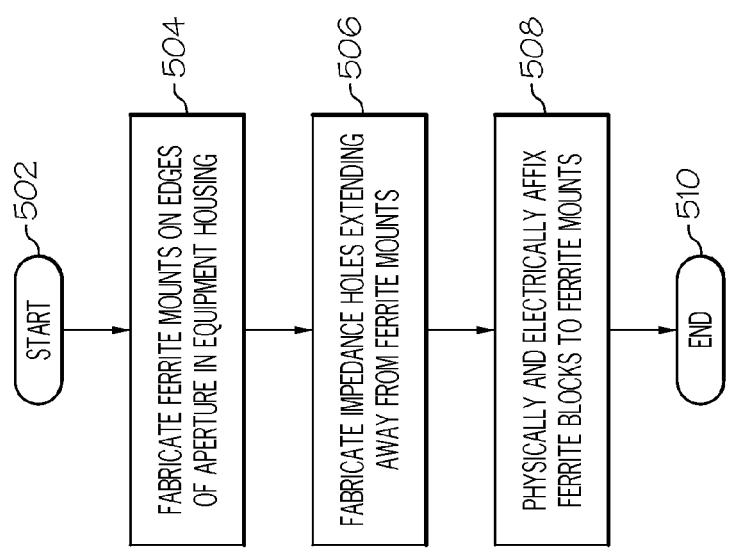
FIG. 5 is a high level flow chart of one or more exemplary steps taken by a computer to fabricate a housing for an electronic device.

With reference now to FIG. 5, a high level flow chart of exemplary steps taken by a computer controlled manufacture device (e.g., CCMM 124 shown in FIG. 1) to construct a housing for an electronic device is presented. After initiator block 502, ferrite mounts are fabricated along one or more edges of an aperture in an enclosure surface of the equipment housing (block 504). As described herein, in one embodiment these ferrite mounts are the result of cutting slots near the aperture. As described in block 506, in order to steer electromagnetically-induced current into the ferrite blocks, impedance holes that extend away from the ferrite mounts (i.e., from the slots that created the ferrite mounts) are cut into the housing. The ferrite blocks are then physically, and thus electrically, connected to the ferrite mounts, such that any electromagnetically-induced current passes through the ferrite blocks for conversion into heat (block 508). The process ends at terminator block 510.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the invention of the present application in detail and by reference to illustrative embodiments thereof, it will be apparent that modifications and variations are possible without departing from the scope of the invention defined in the appended claims.

What is claimed is:

1. An equipment housing comprising:
a metallic enclosure surface;
an aperture through the metallic enclosure surface; and
a ferrite block electrically coupled to a ferrite mount on an edge of the aperture, wherein the ferrite mount is a section of the metallic enclosure surface that is between a slot cut into the metallic enclosure surface and the aperture through the metallic enclosure surface, and wherein the ferrite block transforms electromagnetically-induced current next to the aperture into heat in order to reduce a voltage across the aperture, thereby suppressing aperture edge emissions.

2. The equipment housing of claim 1, further comprising:
a series of multiple impedance holes extending away from the ferrite block and the aperture through the metallic enclosure surface, wherein the series of multiple impedance holes forces the electromagnetically-induced current next to the aperture to pass through the ferrite block.

3. The equipment housing of claim 1, wherein the electromagnetically-induced current is from electromagnetic radiation that originates from electronic circuitry within the equipment housing.

4. The equipment housing of claim 1, wherein the electromagnetically-induced current is from electromagnetic radiation that originates from an electromagnetism source that is outside the equipment housing.

5. The equipment housing of claim 1, further comprising additional ferrite blocks electrically coupled to other edges of the aperture.

6. An electronic device comprising:
electronic circuitry within a housing, the housing comprising:
a metallic enclosure surface;
an aperture through the metallic enclosure surface; and
a ferrite block electrically coupled to a ferrite mount on an edge of the aperture, wherein the ferrite mount is a section of the metallic enclosure surface, wherein the ferrite mount is between a slot cut into the metallic enclosure surface and the aperture through the metallic enclosure surface, and wherein the ferrite block transforms electromagnetically-induced current next to the aperture into heat in order to reduce a voltage across the aperture, thereby suppressing aperture edge emissions.

7. The electronic device of claim 6, wherein the housing further comprises:
a series of multiple impedance holes extending away from the ferrite block and the aperture through the metallic enclosure surface, wherein the series of multiple impedance holes forces the electromagnetically-induced current next to the aperture to pass through the ferrite block.

8. The electronic device of claim 6, wherein the electromagnetically-induced current is from electromagnetic radiation that originates from the electronic circuitry within the housing.

9. The electronic device of claim 6, wherein the electromagnetically-induced current is from electromagnetic radiation that originates from an electromagnetism source that is outside the housing.

10. The electronic device of claim 6, wherein the housing further comprises additional ferrite blocks electrically coupled to other edges of the aperture.

11. The electronic device of claim 6, wherein the electronic device is a computer.

12. A computer controlled method of fabricating a housing for an electronic device, the computer controlled method comprising:
fabricating a ferrite mount to an edge of an aperture in the housing, wherein the ferrite mount is a section of a metallic enclosure surface of the housing, and wherein the ferrite mount is between a slot cut into the metallic enclosure surface and the aperture in the housing; and
physically and electrically affixing a ferrite block to the ferrite mount, wherein the ferrite block transforms electromagnetically-induced current next to the aperture into heat in order to reduce a voltage across the aperture, thereby suppressing aperture edge emissions.

13. The computer controlled method of claim 12, further comprising:
fabricating an impedance hole that extends away from the ferrite mount.

14. The computer controlled method of claim 12, further comprising:
physically and electrically affixing additional ferrite blocks to other ferrite mounts that abut other edges of the aperture.

15. The equipment housing of claim 1, wherein the aperture has multiple sides, and wherein the ferrite block is electrically coupled to one side from the multiple sides of the aperture.

16. The equipment housing of claim 1, wherein the aperture has multiple sides, wherein each of the multiple sides of the aperture is electrically coupled to a separate ferrite block, and wherein all ferrite blocks electrically coupled to the multiple sides of the aperture are physically separated from one another.

* * * * *